United States Patent
Cheng et al.

(10) Patent No.: US 9,514,263 B1
(45) Date of Patent: Dec. 6, 2016

(54) CHEMO EPITAXY MASK GENERATION

(71) Applicant: International Business Machines Corporation, Armonk, NY (US)

(72) Inventors: Joy Cheng, Taipei (TW); Gregory S. Doerk, Mountain View, CA (US); Michael A. Guillorn, Cold Springs, NY (US); Kafai Lai, Poughkeepsie, NY (US); HsinYu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/733,040

(22) Filed: Jun. 8, 2015

(51) Int. Cl.
*G06F 17/50* (2006.01)

(52) U.S. Cl.
CPC .................. *G06F 17/5072* (2013.01)

(58) Field of Classification Search
CPC ........................................... G03F 1/144
USPC ............................................... 716/50
See application file for complete search history.

(56) References Cited

U.S. PATENT DOCUMENTS

| | | | |
|---|---|---|---|
| 7,553,760 B2 | 6/2009 | Yang et al. | |
| 7,977,247 B2 | 7/2011 | Black et al. | |
| 8,336,003 B2 | 12/2012 | Cheng et al. | |
| 2009/0196488 A1 | 8/2009 | Nealey et al. | |
| 2009/0258303 A1 | 10/2009 | Ryu | |
| 2012/0127454 A1 | 5/2012 | Nakamura et al. | |
| 2012/0313170 A1 | 12/2012 | Chang et al. | |
| 2013/0034811 A1 | 2/2013 | Peeters et al. | |
| 2015/0242555 A1* | 8/2015 | Wang .................. | G06F 17/5068 438/694 |

* cited by examiner

*Primary Examiner* — Suresh Memula
(74) *Attorney, Agent, or Firm* — Steven F. McDaniel (57) ABSTRACT

A method to generate chemo-epitaxy masks includes receiving a device pattern comprising a plurality of device geometries, wherein the device pattern conforms to chemo-epitaxy constraints, enlarging the device geometries along a width of the device geometries to provide enlarged device geometries, and using the enlarged device geometries to generate at least one chemo-epitaxy mask corresponding to the device pattern. The at least one chemo-epitaxy mask may include a neutral hard mask and one or more cut masks. The method may also include bridging device geometries that are within a selected distance along a length of the device geometries and merging device geometries that overlap. The method may also include filling break regions between the device geometries with a neutral fill pattern. A corresponding computer program product and computer system are also disclosed herein.

20 Claims, 12 Drawing Sheets

CHEMO EPITAXY MASK GENERATION

STATEMENT REGARDING FEDERALLY SPONSORED RESEARCH OR DEVELOPMENT

This invention was made with U.S. Government support under contract number FA8650-10-C-7038 awarded by the Defense Advanced Research Projects Agency (DARPA). The U.S. Government has certain rights to this invention.

BACKGROUND OF THE INVENTION

The present invention relates generally to semiconductor device fabrication and specifically to generating chemo-epitaxy masks for semiconductor devices including finned semiconductor devices.

The directed self-assembly (DSA) of block co-polymers (BCPs) is a promising technology to extend patterning resolution. Chemo-epitaxy, a form of DSA, has been demonstrated to reliably generate dense grating and hexagonal arrays from sparse chemical pre-patterns comprising a directing (pinning) region and a non-directing (neutral) region that support perpendicular orientation of BCP domains. Typically, the directing region confers alignment on the BCP domains via a preferential affinity to one of the domains. The neutral region may have little or no affinity to any of the domains. In one embodiment, for a block co-polymer with a bulk periodicity (pitch) of Lo ("L nought"), the width of the directing regions can be approximately $0.5 \times Lo$ (i.e., 0.5 times Lo) or approximately $1.5 \times N \times Lo$ where N is a positive integer.

SUMMARY

A method to generate chemo-epitaxy masks includes receiving a device pattern comprising a plurality of device geometries, wherein the device pattern conforms to chemo-epitaxy constraints, enlarging the device geometries along a width of the device geometries to provide enlarged device geometries, and using the enlarged device geometries to generate at least one chemo-epitaxy mask corresponding to the device pattern. The at least one chemo-epitaxy mask may include a neutral hard mask and one or more cut masks. The method may also include bridging device geometries that are within a selected distance along a length of the device geometries and merging device geometries that overlap. The method may also include filling break regions between the device geometries with a neutral fill pattern. A corresponding computer program product and computer system are also disclosed herein.

DETAILED DESCRIPTION

The embodiments disclosed herein enable the generation of chemo-epitaxy masks for patterning semiconductor devices including finned semiconductor devices.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

A block co-polymer for self-assembly comprises at least two blocks that are immiscible with each other. Self-assembly of the block co-polymer occurs by phase separation of the blocks to form a pattern of segregated solid phase domains. The directed self-assembly of the segregated solid phase domains may be controlled by a pre-pattern formed over one or more layers (e.g. of a semi-conductor device) that are to be patterned according to the pre-pattern aligned block co-polymer.

Figure 1A:
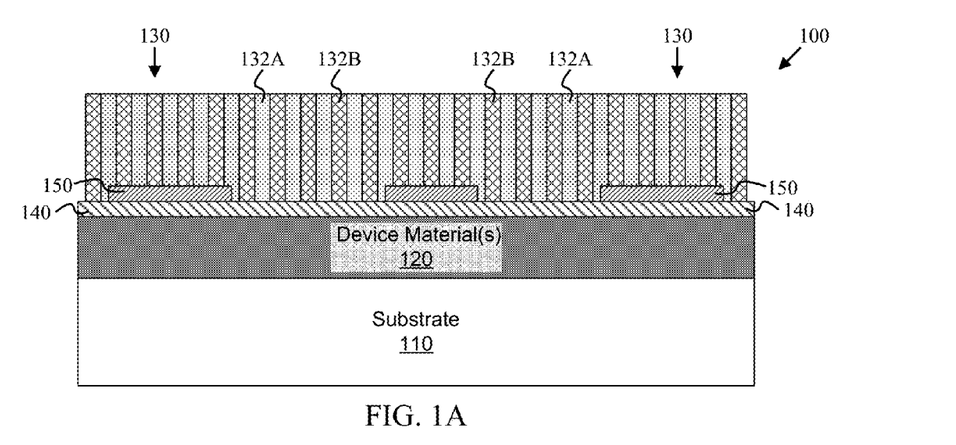
FIGS. 1A-1C are cross-sectional view illustrations of a semiconductor device during various stages of chemo-epitaxial patterning in accordance with the present invention.
Figure 1B:
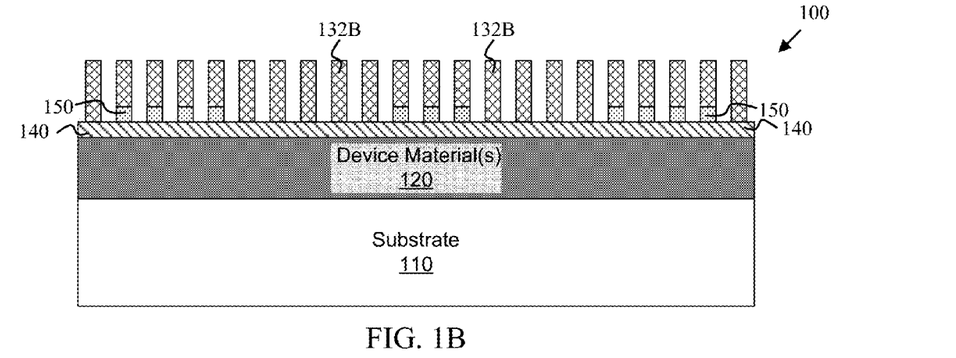
Figure 1C:
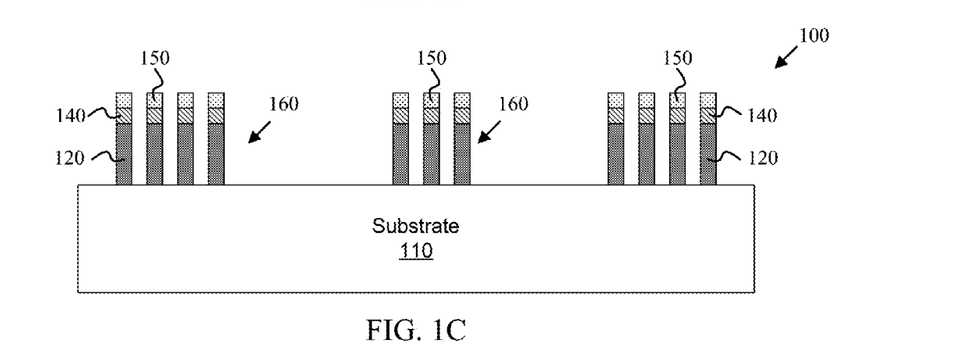

For example, FIGS. 1A-1C are cross-sectional view illustrations of a semiconductor device 100 during various stages of chemo-epitaxial patterning in accordance with the present invention. Manufacture of the semiconductor device 100, or the like, is one example of an application suitable for the present invention.

A substrate 110 may have one or more device materials 120 formed thereon that are to be patterned. In the depicted embodiment, the device material(s) 120 are used to form device features 160 such as fins. To facilitate high density patterning of the device material(s) 120, directed self-assembly (DSA) of a di-block polymer 130 may be used to provide alternating blocks of two co-polymers 132 (i.e., 132A and 132B). In the depicted embodiment, the co-polymers 132 have a pitch of Lo.

A pinning layer 140 and a neutral layer 150 may be formed over the device material(s) 120. The pinning layer 140 and the neutral layer 150 may be patterned to direct the self-assembly of the block co-polymer 130. In the depicted embodiment, the neutral layer 150 is deposited onto the pinning layer 140 and patterned to expose selected regions of the pinning layer 140. In another embodiment, the pinning layer 140 is disposed above the neutral layer 150 and patterned to expose selected regions of the neutral layer 150.

The patterned and exposed pinning layer 140 and neutral layer 150 in either embodiment may be referred to as a pre-pattern in that the final pattern imposed on the device material(s)(s) 120 is determined by the chemo-epitaxial interaction between the co-polymers 132 and the layers 140 and 150.

For example, the pinning layer 140 may have a preferential affinity to one of the co-polymers 132 which in the depicted embodiment is the co-polymer 132B. The preferential affinity may align the block co-polymers 132 to the exposed portions of the pinning layer 140. In some embodiments, the block co-polymers 132 have a bulk periodicity of Lo and the width of the exposed portions of the pinning layer 140 is approximately 0.5×Lo (i.e., 0.5 times Lo) or approximately 1.5×N×Lo, where N is a positive integer.

As shown in FIG. 1B, the pre-pattern aligned co-polymers 132 may undergo a first etch that selectively removes one of the co-polymers 132. In the depicted embodiment, the co-polymer 132A is removed and the co-polymer 132B is used as a mask for a second etch that patterns the device material(s) 120 as shown in FIG. 1C. Subsequently, the pinning layer 140 and the neutral layer 150 may be removed to facilitate further processing of the semiconductor device 100 with patterned device features 160.

Examples of the co-polymers 132 include block copolymers of poly(styrene (PS)-block-methyl methacrylate) or PS-b-PMMA. Examples of a pinning layer 140 include a polystyrene grating layer. Examples of materials suitable for the neutral layer 150 include silicon dioxide or silicon nitride. In some embodiments, only the surface of the neutral layer 150 is neutral. For example, an oxide may be formed on the surface of the neutral layer 150.

Figure 2:
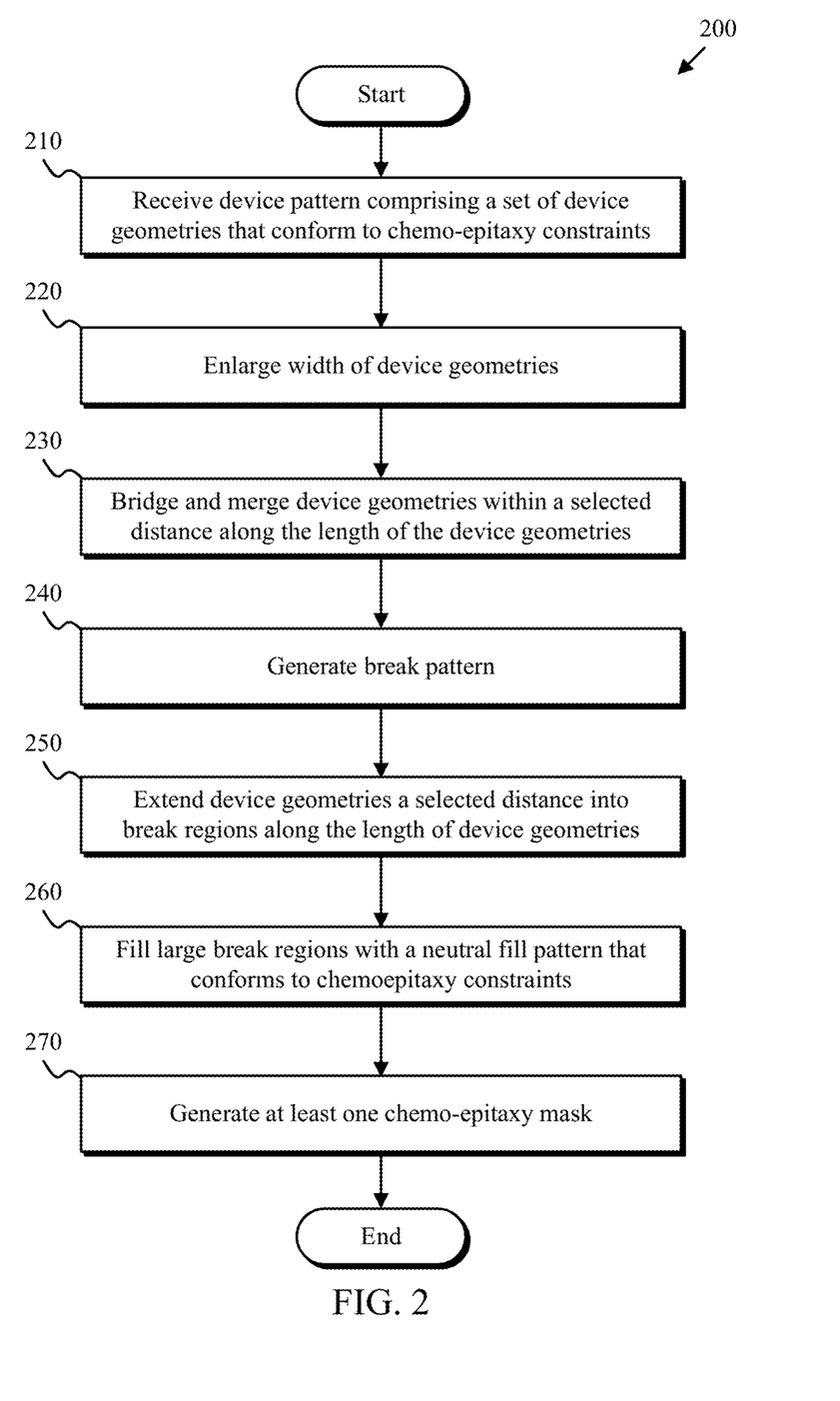
FIG. 2 is flowchart depicting one embodiment of a chemo-epitaxy mask generation method in accordance with the present invention.

FIG. 2 is flowchart depicting one embodiment of a chemo-epitaxy mask generation method 200 in accordance with the present invention. As depicted, the chemo-epitaxy mask generation method 200 includes receiving (210) a device pattern comprising device geometries, enlarging (220) the width of the device geometries, bridging and merging (230) device geometries, generating (240) a break pattern, extending (250) the device geometries, filling (260) large break regions, and generating (270) at least one chemo-epitaxy masks. The chemo-epitaxy mask generation method 200 may be used to generate chemo-epitaxy masks suitable for pre-patterning semiconductor devices, including finned semiconductor devices.

Figure 3A:
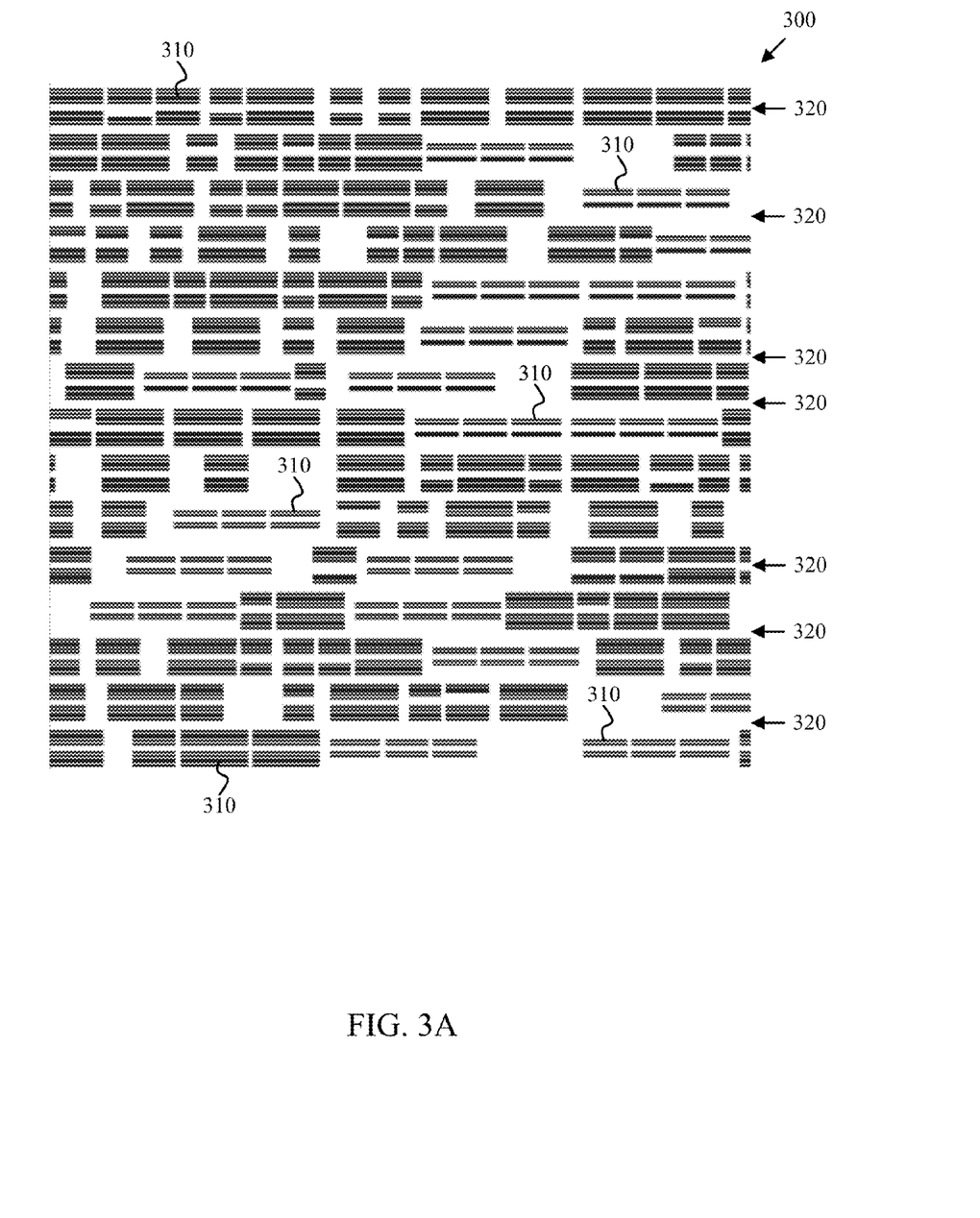
FIGS. 3A-3F are layout diagrams depicting examples of patterns associated with at least one embodiment of the method of FIG. 2.

As shown in FIG. 3A, receiving (210) a device pattern may include receiving a device pattern 300 that comprises various device geometries 310. The device pattern 300 may conform to chemo-epitaxy constraints. For example, in the depicted embodiment, the device geometries 310 correspond to fins for finned semiconductor devices. Each of the depicted device geometries are oriented such that the length of the device geometries 310 are along the horizontal axis and the width of the device geometries are along the vertical axis. Consequently, in the depicted embodiment (as will be subsequently described in greater detail) pinning may occur in horizontal swaths 320 that have no device geometries 310 and are vertically spaced to conform to chemo-epitaxy constraints. As a result, chemo-epitaxial patterning may be used to provide a vertical resolution for the depicted device pattern 300 that is greater than the horizontal resolution. However, the embodiments disclosed herein are not limited to a single orientation, or a particular orientation, so long as the placement of the device geometries conforms to chemo-epitaxy constraints.

Figure 3B:
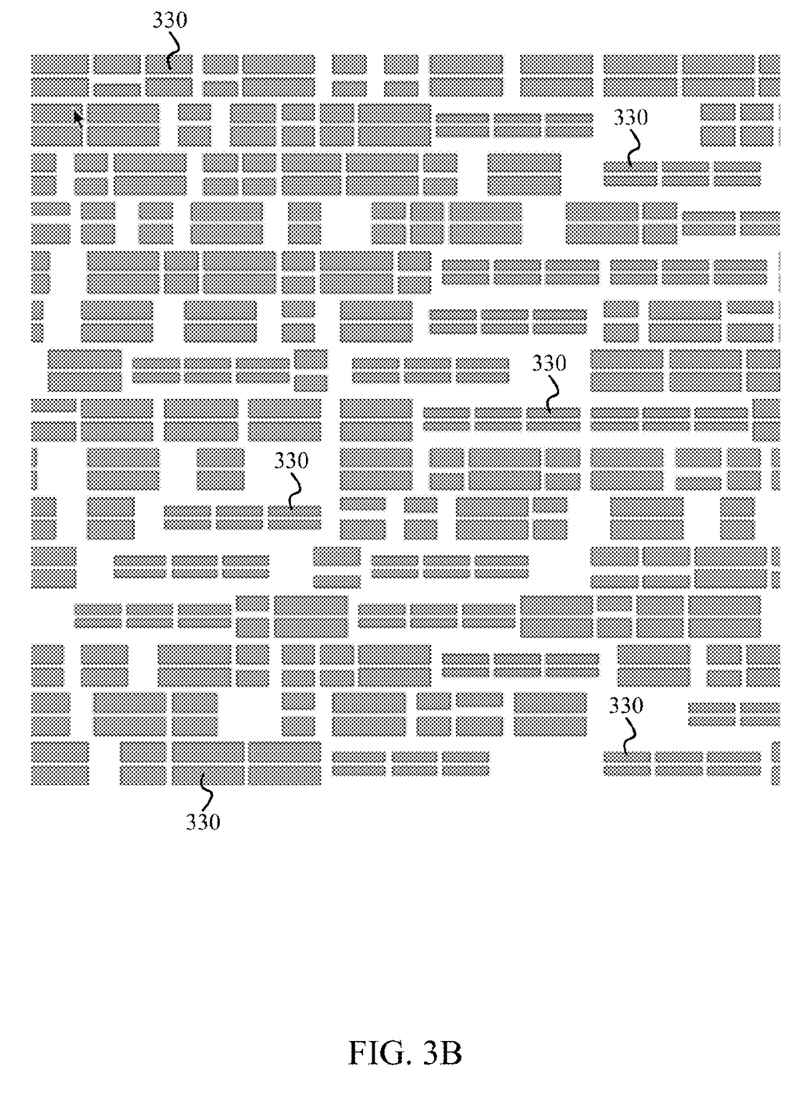

As shown in FIG. 3B, enlarging (220) the width of the device geometries may include increasing the width so that small gaps that are unable to support pinning (e.g., <0.5*Lo) are removed between the device geometries. The width of the device geometries 310 may be increased to provide enlarged geometries 330. In some embodiments, the width of the device geometries 310 (depicted as the vertical distance) is increased along both sides of their width (which is above and below the device geometries in the depicted embodiment) by L0-Wfin where L0 is the natural period of the BCP and Wfin is the drawn fin width in the layout. The enlarged device geometries 330 that overlap may be merged to eliminate redundant coverage.

Figure 3C:
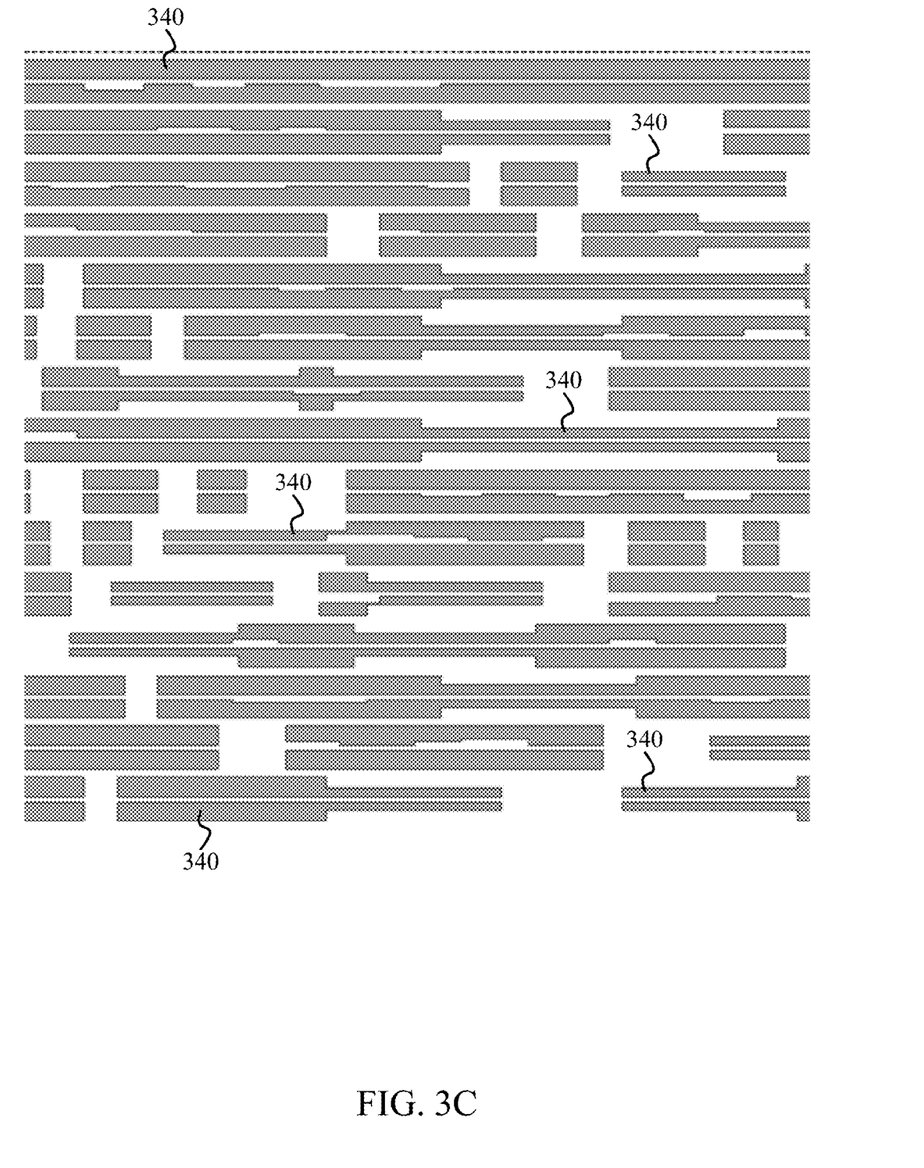

As shown in FIG. 3C, bridging and merging (230) device geometries may include finding device geometries 310 or enlarged geometries 330 that are within a selected distance of each other along the length of the corresponding device geometries 310 and bridging and merging those geometries. For example, the lengthwise gap (in the horizontal direction in FIG. 3C) between the enlarged geometries 330 that are within a selected distance of each other may be bridged with a spanning geometry that is merged with adjacent enlarged geometries to provide merged geometries 340. In one embodiment, the selected distance is approximately four times the gate pitch. Enlarged geometries 330 that are not bridged and merged may be included in the merged geometries 340 to facilitate subsequent formation of one or more chemo-epitaxy masks.

Figure 3D:
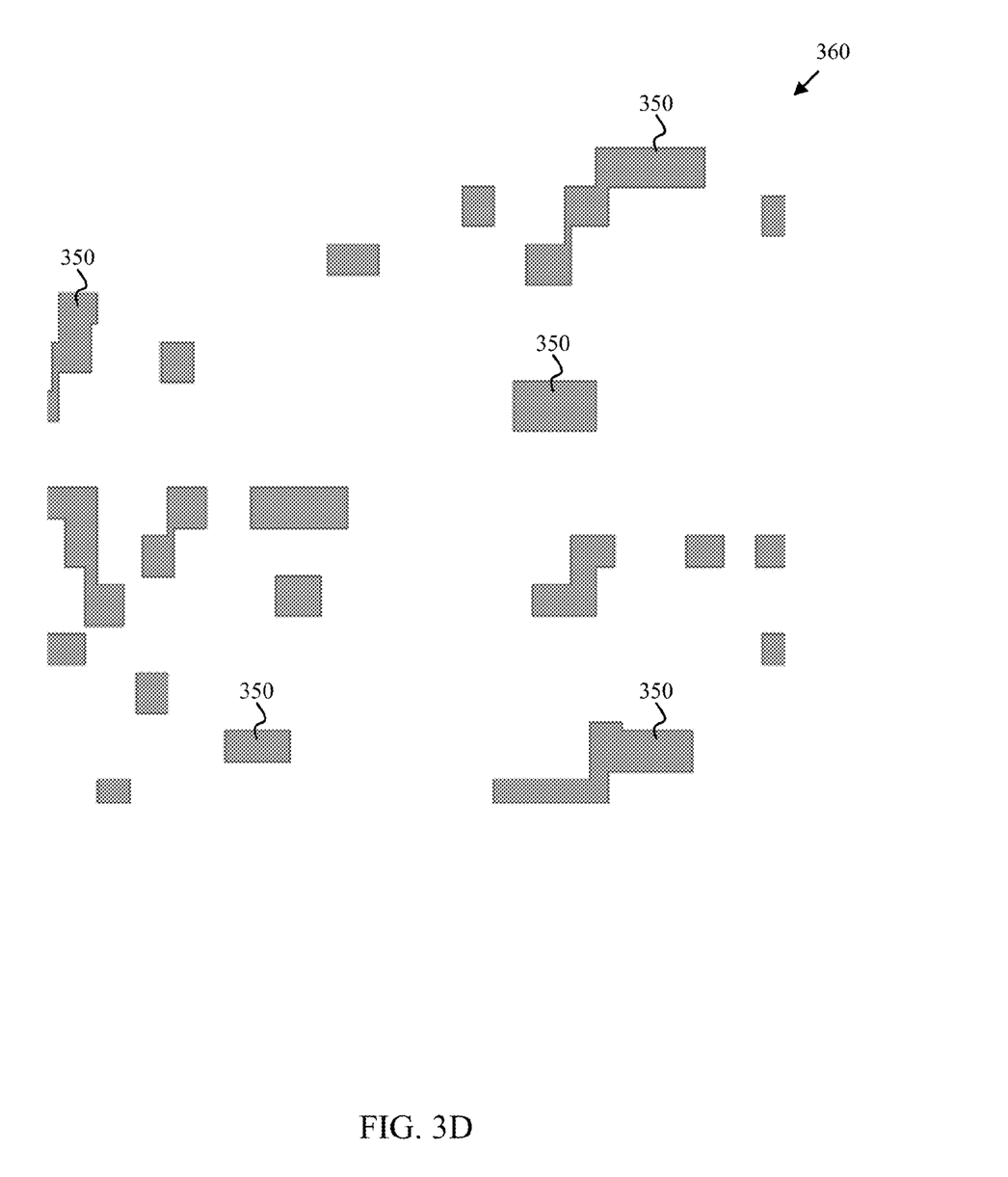

As shown in FIG. 3D, generating (240) a break pattern may include determining gaps that are between the merged geometries 340 or the enlarged geometries 330. The gaps may be filled with break geometries 350 that collectively form the break pattern 360. In some embodiments, specific constraints such as minimum width and height are imposed on the break geometries. Break geometries that overlap may, or may not be, merged.

Figure 3E:
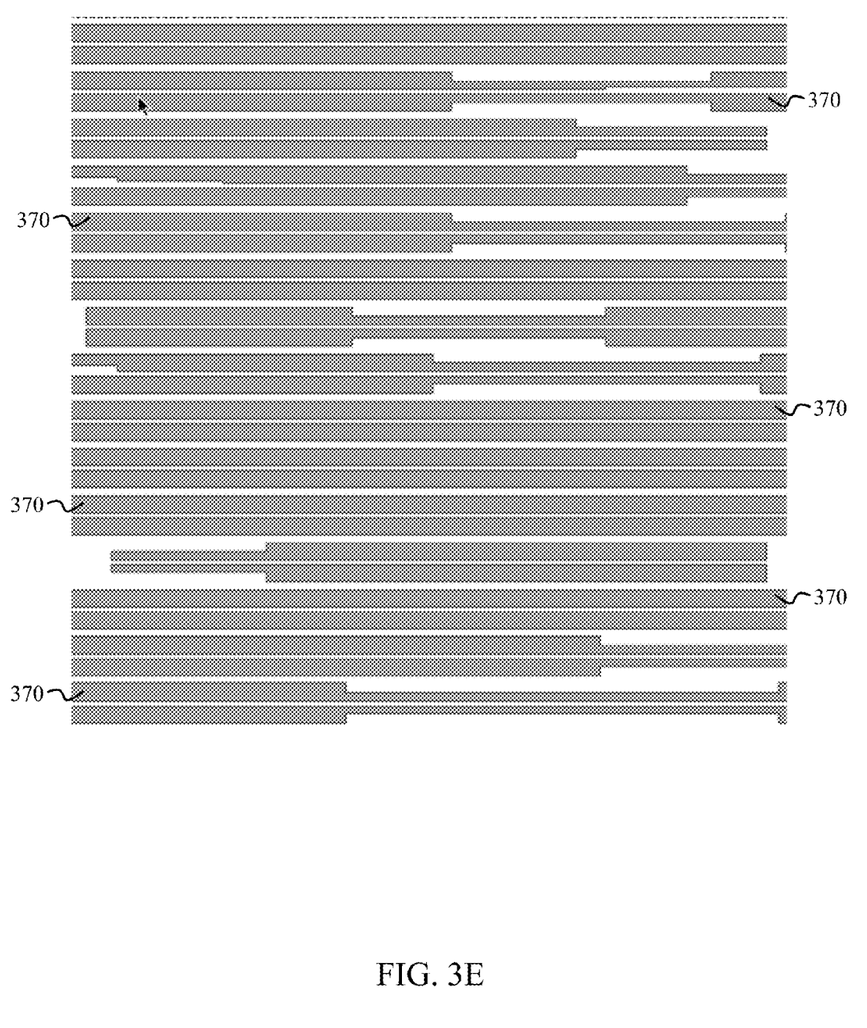

Extending (250) the device geometries may include extending the length of any of the above geometries into break regions. As depicted in FIG. 3E, the merged geometries 340 are extended along their length to provide extended geometries 370.

Figure 3F:
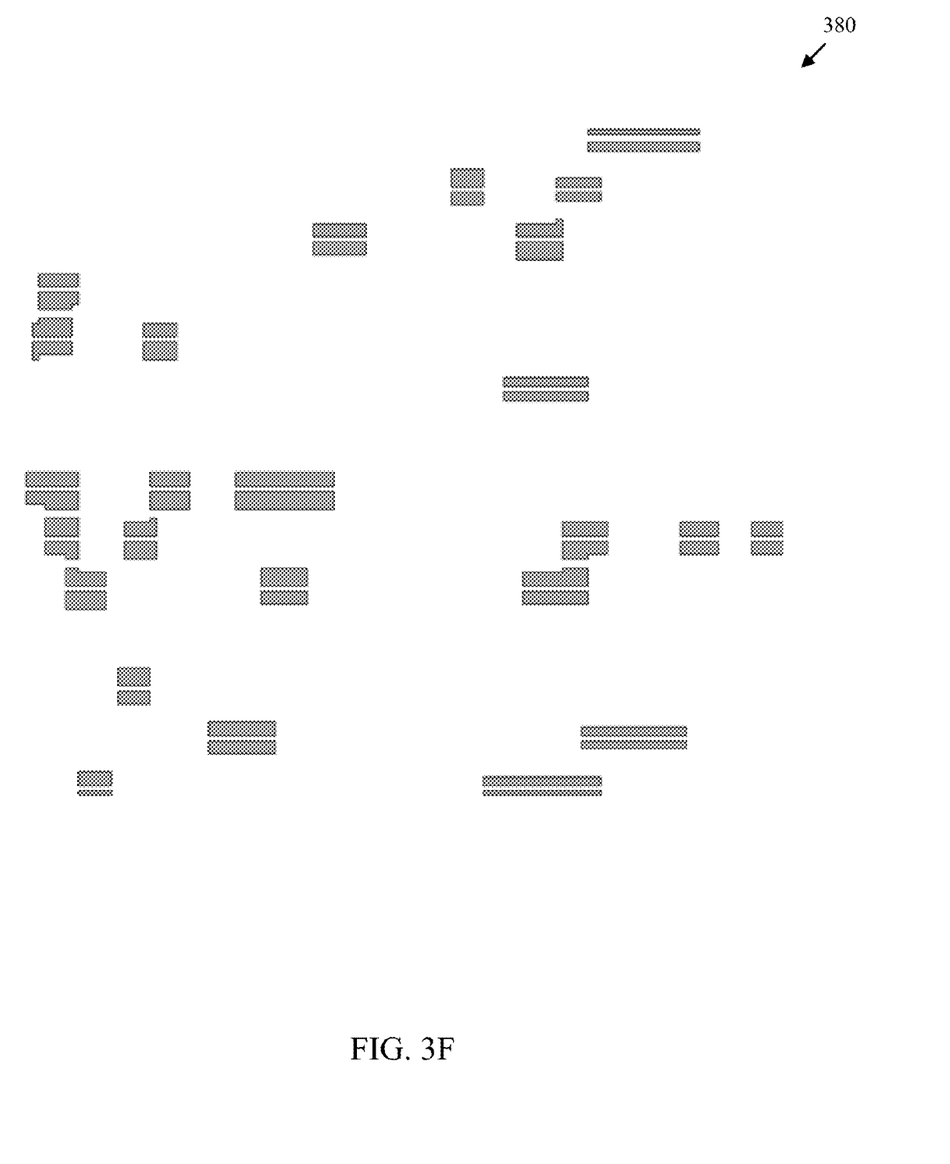

Filling (260) large break regions may include filling break regions that are sufficiently large with a neutral pattern that supports chemo-epitaxy. For example, FIG. 3F shows how a neutral fill pattern 380 may be generated by ANDing the break pattern 360 with a neutral pattern (not shown). The neutral pattern can take on different sizes and can be adjusted based on the tolerances of the templating lithography. The neutral fill pattern 380 assists in directed self-assembly by providing a neutral fill within regions where there is no pattern data to maintain a similar pattern density.

Figure 4A:
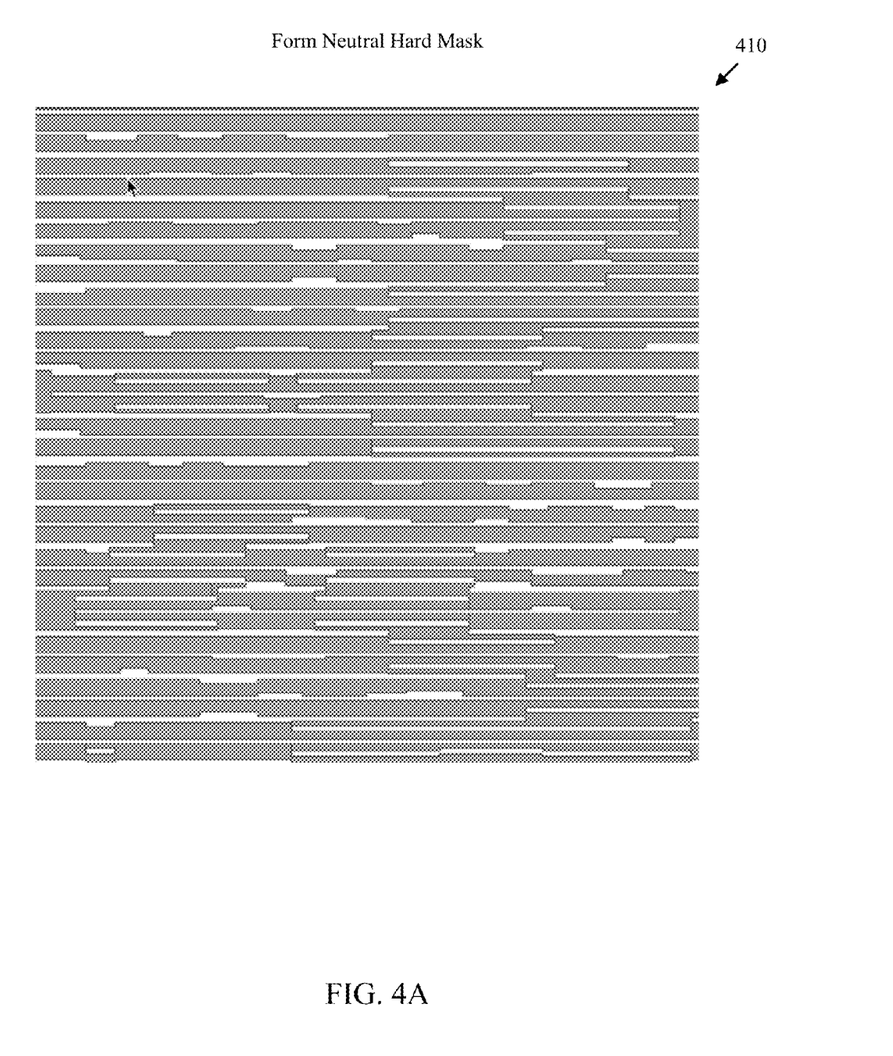
FIGS. 4A-4C are layout diagrams depicting examples of chemo-epitaxy masks associated with at least one embodiment of the method of FIG. 2.

Generating (270) at least one chemo-epitaxy mask may include generating a neutral hard mask and one or more cut masks from the various patterns described above. For example, FIG. 4A shows a neutral hard mask 410 that is generated from the above presented patterns. The neutral hard mask 410 can be a hard mask material treated with a neutral chemical coating or a hard mask that provides the neutral surface required for directed self-alignment of a block co-polymer.

Figure 4B:
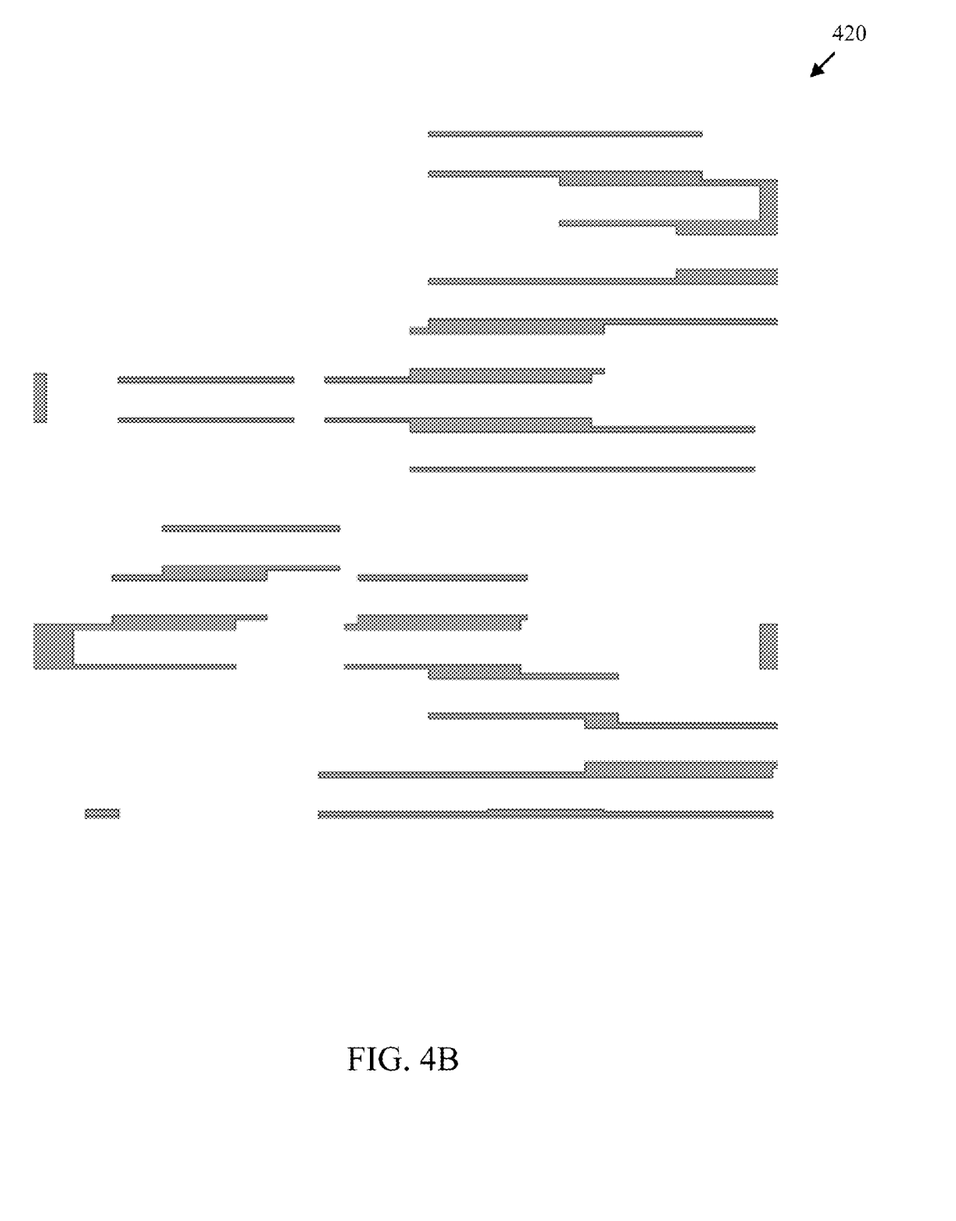
Figure 4C:
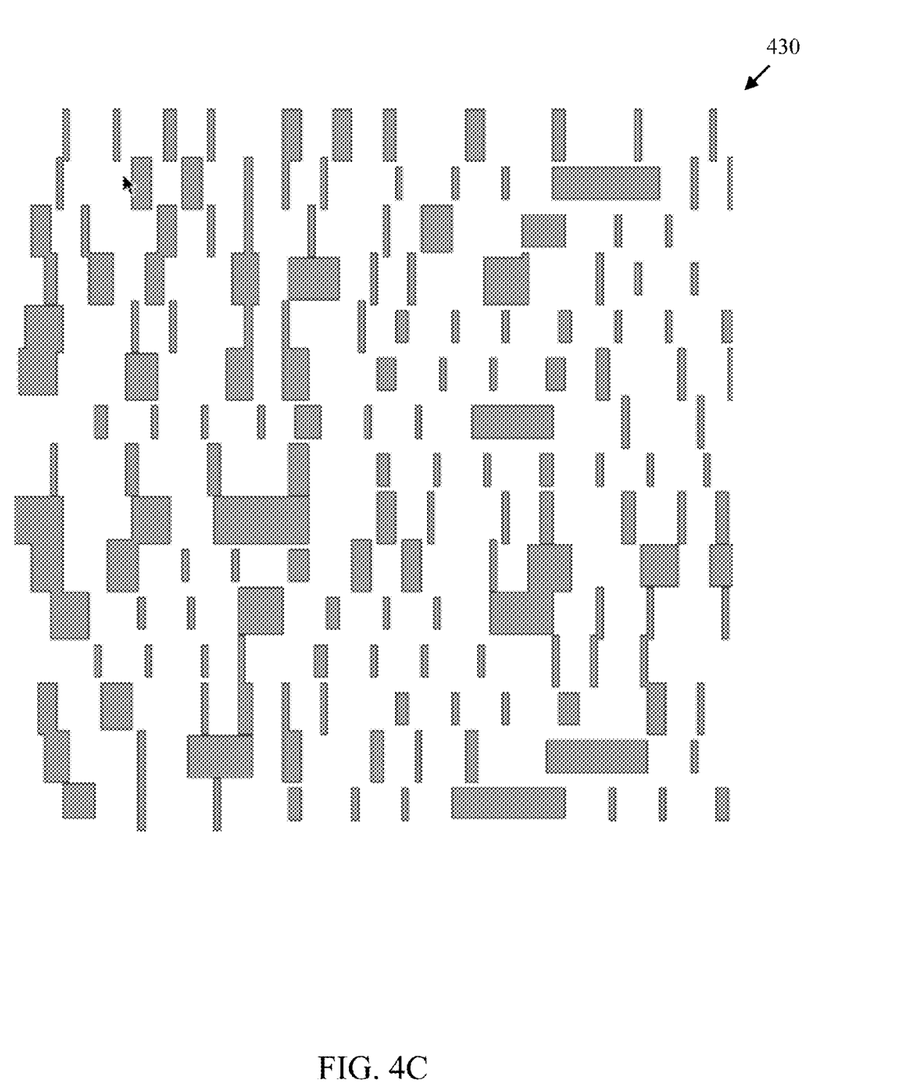

FIGS. 4B and 4C show, respectively, a vertical cut mask 420 and a horizontal cut mask 430 that are used to cut (i.e., etch) out regions that may be patterned by chemo-epitaxy (e.g. using the neutral hard mask 410) that do not correspond to semiconductor devices. The vertical cut mask may have more vertical resolution than horizontal resolution and the horizontal cut mask may have greater horizontal resolution than vertical resolution. In some embodiments, a single cut mask is used in place of the vertical cut mask 420 and the horizontal cut mask 430.

The cut mask data can be merged with the neutral hard mask (or more generally template) data to create complex 2D patterns with a single template exposure. Features from the cut mask data can be moved to the template data if it facilitates the patterning of the stemplate data by using a lithography method that has sufficient resolution.

By using a patterned neutral hard mask, the above described methods can produce patterns that are suitable for high resolution patterning such as FinFET circuit patterning. For example, the above described methods can remove features from a block co-polymer produced grating with an accuracy of a single line (e.g., ~0.5·Lo).

One of skill in the art will appreciate the disclosed embodiments provide a number of options for generating chemo-epitaxy masks that support chemo-epitaxial patterning. One of skill in the art will also appreciate that the various options be conducted in a variety of combinations and orders that are effective. For example, some of the operations shown in FIG. 2 may be omitted and many of the operations need not be conducted in the depicted order. Furthermore, some of the operations may not be fully automated and may include manual aspects (e.g., manual invocation of a series of utilities by a user).

Figure 5:
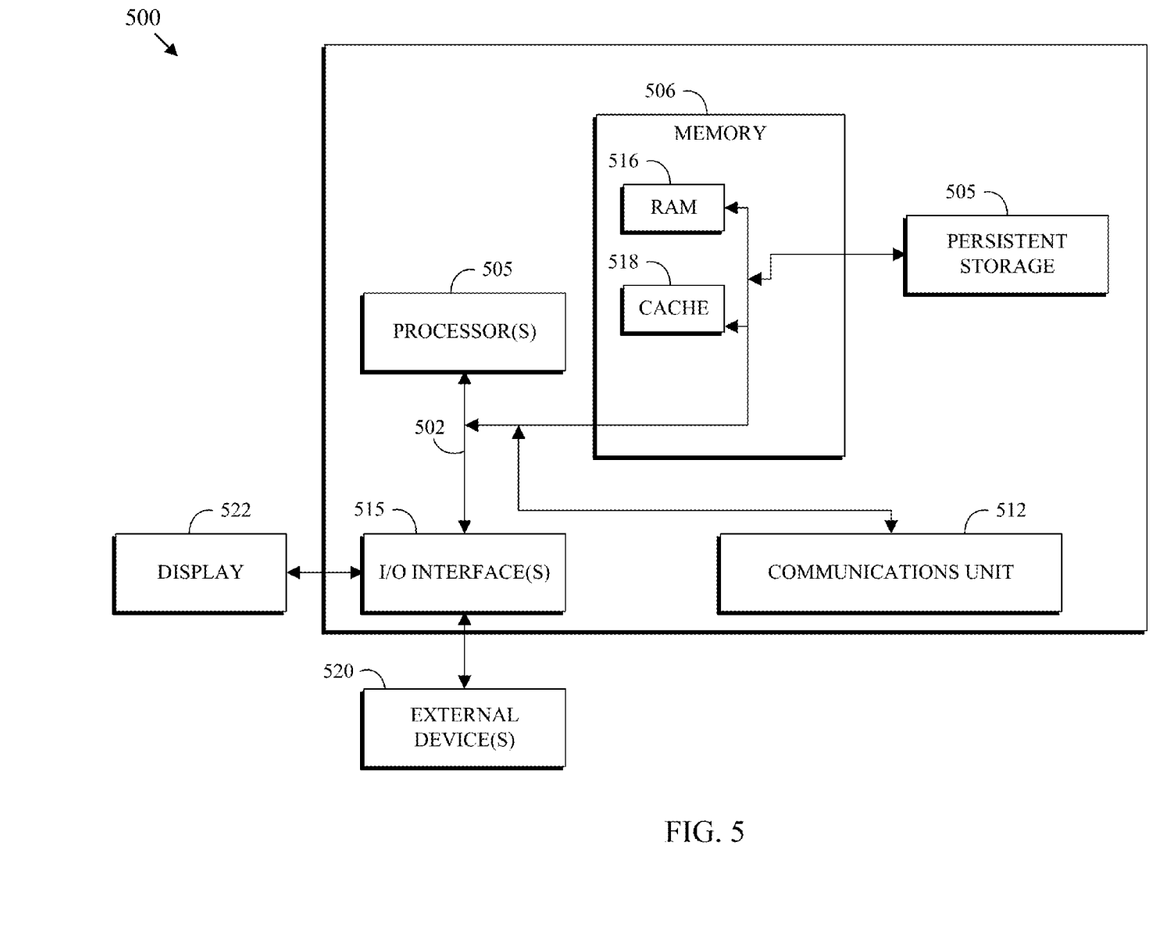
FIG. 5 is a block diagram depicting one example of a computing apparatus (e.g., computer) suitable for executing the methods disclosed herein.

FIG. 5 is a block diagram depicting one example of a computing apparatus (i.e., computer 500) suitable for partially or wholly executing the methods disclosed herein. It should be appreciated that FIG. 5 provides only an illustration of one embodiment and does not imply any limitations with regard to the environments in which different embodiments may be implemented. Many modifications to the depicted environment may be made.

As depicted, the computer 500 includes communications fabric 502, which provides communications between computer processor(s) 505, memory 506, persistent storage 508, communications unit 512, and input/output (I/O) interface(s) 515. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In the depicted embodiment, memory 506 includes random access memory (RAM) 516 and cache memory 518. In general, memory 506 can include any suitable volatile or non-volatile computer readable storage media.

One or more programs may be stored in persistent storage 508 for execution by one or more of the respective computer processors 505 via one or more memories of memory 506. The persistent storage 508 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 512, in these examples, provides for communications with other data processing systems or devices. In these examples, communications unit 512 includes one or more network interface cards. Communications unit 512 may provide communications through the use of either or both physical and wireless communications links.

I/O interface(s) 515 allows for input and output of data with other devices that may be connected to computer 500. For example, I/O interface 515 may provide a connection to external devices 520 such as a keyboard, keypad, a touch screen, and/or some other suitable input device. External devices 520 can also include portable computer readable storage media such as, for example, thumb drives, portable optical or magnetic disks, and memory cards.

Software and data used to practice embodiments of the present invention can be stored on such portable computer readable storage media and can be loaded onto persistent storage 508 via I/O interface(s) 515. I/O interface(s) 515 may also connect to a display 522. Display 522 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The embodiments disclosed herein include a system, a method, and/or a computer program product. The computer program product may include a computer readable storage medium (or media) having computer readable program instructions thereon for causing a processor to carry out the methods disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method to generate chemo-epitaxy masks, the method comprising:
   receiving a device pattern comprising a plurality of elongated device geometries, wherein the device pattern conforms to a bulk periodicity of a block copolymer along a width of the elongated device geometries;
   enlarging the elongated device geometries along the width of the elongated device geometries to provide widened device geometries; and
   using the widened device geometries to generate at least one chemo-epitaxy mask corresponding to the device pattern.

2. The method of claim 1, wherein the at least one chemo-epitaxy mask comprises a neutral hard mask.

3. The method of claim 1, wherein the at least one chemo-epitaxy mask comprises one or more cut masks.

4. The method of claim 1, further comprising bridging elongated device geometries that are within a selected distance along a length of the elongated device geometries.

5. The method of claim 1, further comprising merging widened device geometries that overlap.

6. The method of claim 1, further comprising filling break regions between the device geometries with a neutral fill pattern.

7. The method of claim 6, wherein the neutral fill pattern comprises a plurality of neutral geometries corresponding to neutral chemo-epitaxy regions.

8. The method of claim 6, wherein the neutral fill pattern conforms to the bulk periodicity of the block copolymer.

9. A computer program product comprising:
one or more computer readable storage media and program instructions stored on the one or more computer readable storage media, the program instructions comprising instructions to:
receive a device pattern comprising a plurality of elongated device geometries, wherein the device pattern conforms to a bulk periodicity of a block copolymer along a width of the elongated device geometries;
enlarge the device geometries along a width of the elongated device geometries to provide widened device geometries; and
use the widened device geometries to generate at least one chemo-epitaxy mask corresponding to the device pattern.

10. The computer program product of claim 9, wherein the at least one chemo-epitaxy mask comprises a neutral hard mask.

11. The computer program product of claim 9, wherein the at least one chemo-epitaxy mask comprises one or more cut masks.

12. The computer program product of claim 9, wherein the program instructions comprise instructions to bridge elongated device geometries that are within a selected distance along a length of the elongated device geometries.

13. The computer program product of claim 12, wherein the program instructions comprise instructions to fill large break regions between the bridged geometries with a neutral fill pattern.

14. The computer program product of claim 13, wherein the neutral fill pattern comprises a plurality of neutral geometries corresponding to neutral chemo-epitaxy regions.

15. The computer program product of claim 13, wherein the neutral fill pattern conforms to the bulk periodicity of the block copolymer.

16. A computer system comprising:
one or more computers;
one or more computer readable storage media and program instructions stored on the one or more computer readable storage media for execution by at least one of the computers, the program instructions comprising instructions to:
receive a device pattern comprising a plurality of elongated device geometries, wherein the device pattern conforms to a bulk periodicity of a block copolymer along a width of the elongated device geometries;
enlarge the device geometries along a width of the elongated device geometries to provide widened device geometries; and
use the widened device geometries to generate at least one chemo-epitaxy mask corresponding to the device pattern.

17. The computer system of claim 16, wherein the at least one chemo-epitaxy mask comprises a neutral hard mask.

18. The computer system of claim 16, wherein the at least one chemo-epitaxy mask comprises one or more cut masks.

19. The computer system of claim 16, wherein the program instructions comprise instructions to bridge elongated device geometries that are within a selected distance along a length of the elongated device geometries.

20. The computer system of claim 16, wherein the program instructions comprise instructions to merge enlarged widened device geometries that overlap.

* * * * *